(12) United States Patent
Nishikawa

(10) Patent No.: US 8,035,040 B2
(45) Date of Patent: Oct. 11, 2011

(54) ELECTRICAL JUNCTION BOX PROVIDED WITH ELECTRIC CURRENT SENSOR

(75) Inventor: Kenichi Nishikawa, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 258 days.

(21) Appl. No.: 12/453,992

(22) Filed: May 28, 2009

(65) Prior Publication Data

US 2010/0025102 A1      Feb. 4, 2010

(30) Foreign Application Priority Data

Jul. 31, 2008   (JP) ................................ 2008-198298

(51) Int. Cl.
*H05K 7/02* (2006.01)
*H01L 23/48* (2006.01)
(52) U.S. Cl. ........................ 174/541; 174/549; 439/76.2
(58) Field of Classification Search ................... 174/541, 174/549; 439/76.2; 324/117 H
See application file for complete search history.

(56) References Cited

U.S. PATENT DOCUMENTS

| | | | | |
|---|---|---|---|---|
| 6,404,628 B1 * | 6/2002 | Nagashima et al. | ........... | 361/690 |
| 7,542,318 B2 * | 6/2009 | Otsuka et al. | ................ | 363/178 |
| 7,751,201 B2 * | 7/2010 | Fujino et al. | .................. | 361/775 |
| 2003/0108789 A1 * | 6/2003 | Yamakawa et al. | ........... | 429/121 |
| 2005/0237049 A1 * | 10/2005 | Ozaki et al. | ................ | 324/117 H |
| 2006/0119343 A1 * | 6/2006 | Saito et al. | ................ | 324/117 H |
| 2007/0015384 A1 * | 1/2007 | Asao | ............................ | 439/76.2 |
| 2007/0200551 A1 * | 8/2007 | Muraki et al. | ................ | 324/127 |
| 2007/0257659 A1 * | 11/2007 | Nomoto et al. | ............ | 324/76.11 |
| 2007/0285864 A1 * | 12/2007 | Yoshida et al. | .............. | 361/93.1 |

FOREIGN PATENT DOCUMENTS

JP      A-2007-028773      2/2007

* cited by examiner

*Primary Examiner* — Hung Ngo
(74) *Attorney, Agent, or Firm* — Oliff & Berridge, PLC

(57) ABSTRACT

An electric current sensor is disposed in an upper end part of a casing in an electrical junction box. A detecting bus bar penetrates a through-hole in the electric current sensor so that opposite ends of the detecting bus bar project from the through-hole. A bolt hole is provided in an input side portion on one end projecting from the through-hole. Bolt holes are provided in an output side portion on the other end projecting from the through-hole. A bolt hole is provided in an input side bus bar. The input side bus bar is disposed below the input side portion so that the bolt hole is communicated with the bolt hole. Bolt holes are provided in output side bus bars. The output side bus bars are disposed below the output side portion so that the bolt holes are communicated with the bolt holes. Bolts are inserted downward into the communicated bolt holes to secure the electric current sensor to the input and output side bus bars. The electric current sensor can be removed from the input and output side bus bars by releasing the bolts.

6 Claims, 10 Drawing Sheets

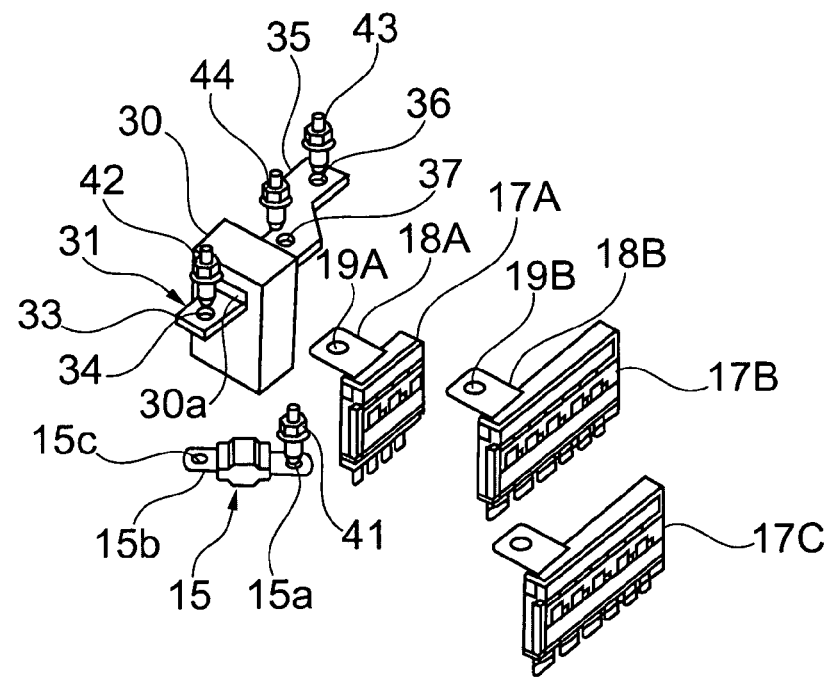
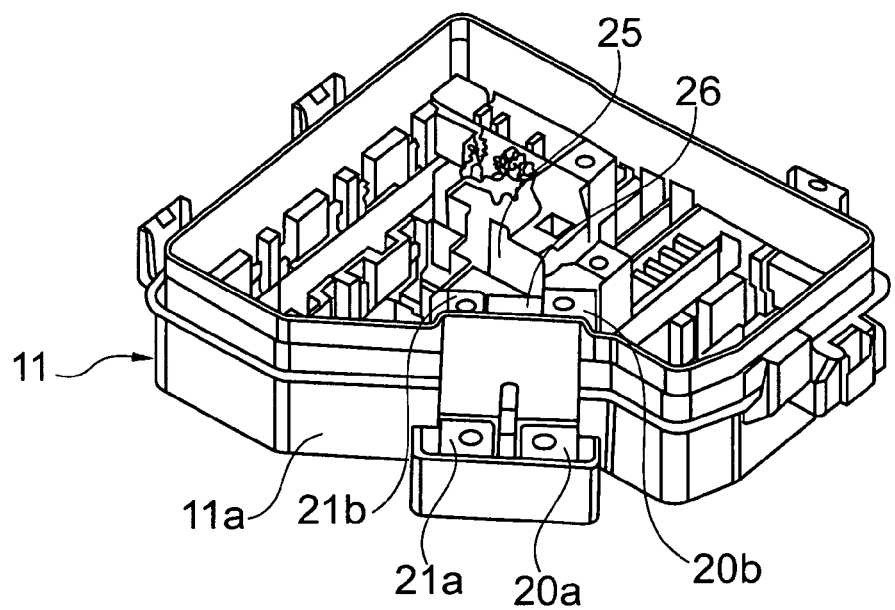
Fig. 2

[Fig. 3]
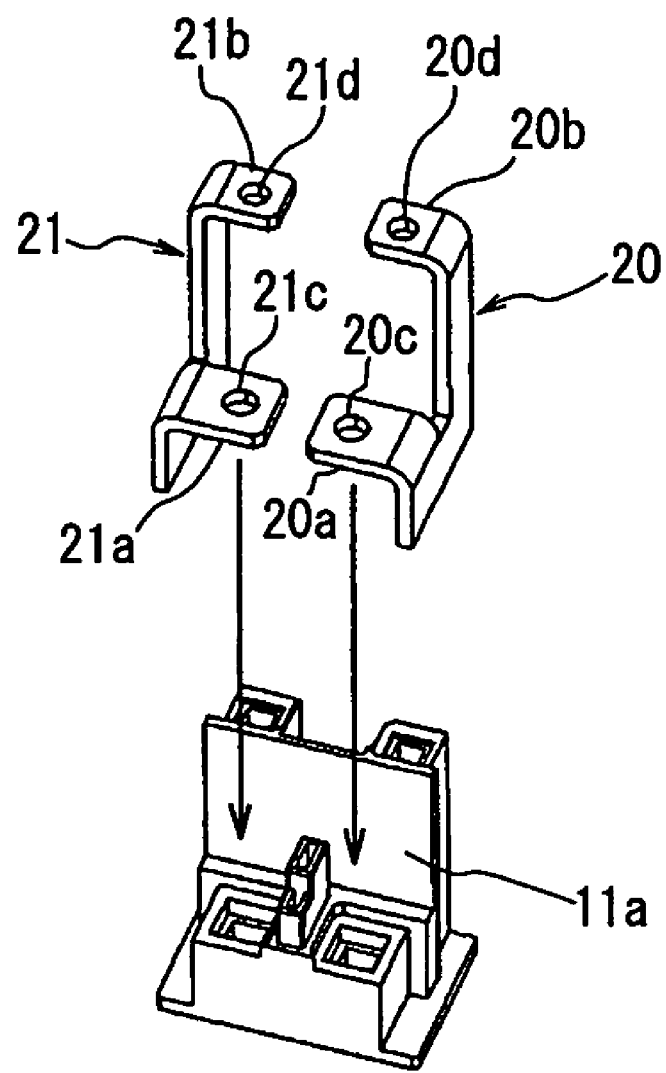

[Fig. 4]
(A)
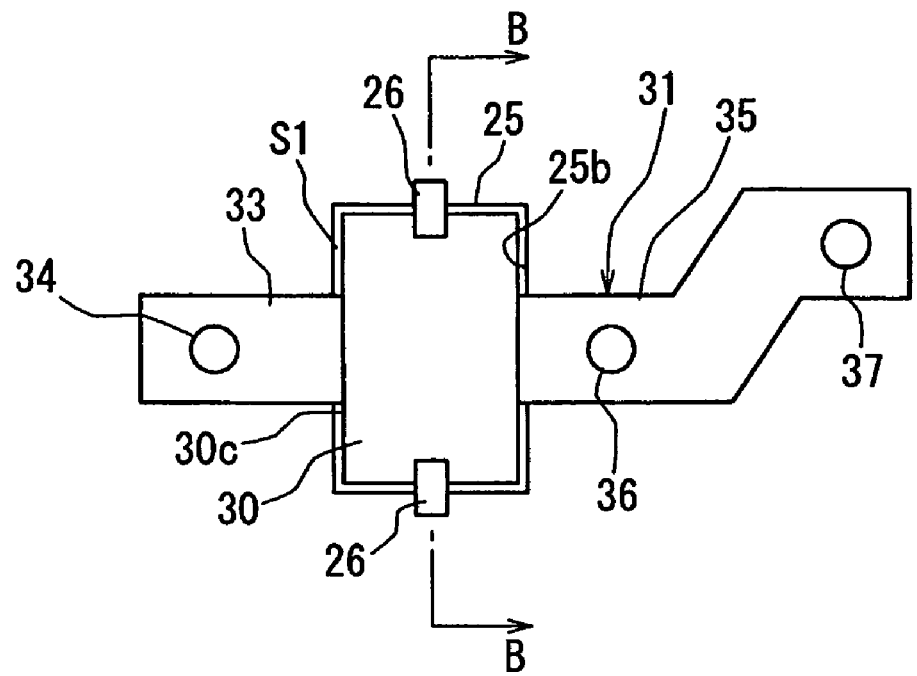
(B)
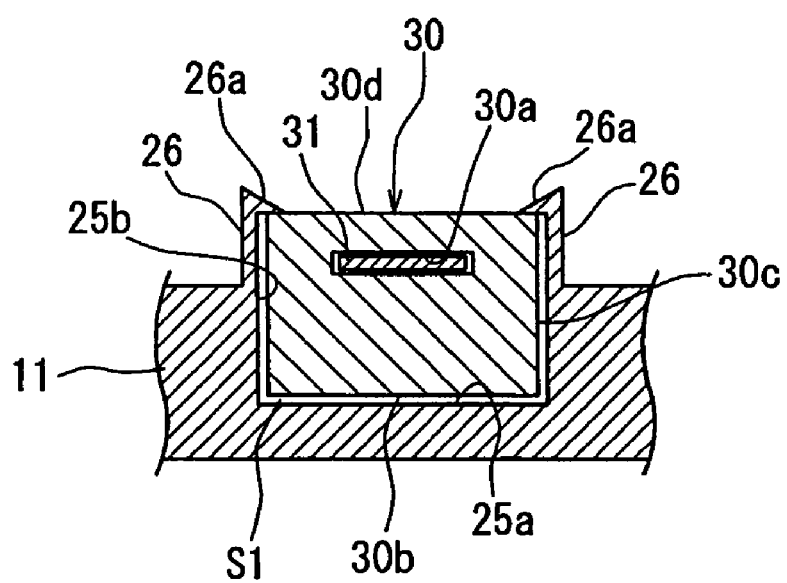

[Fig. 5]
(A)
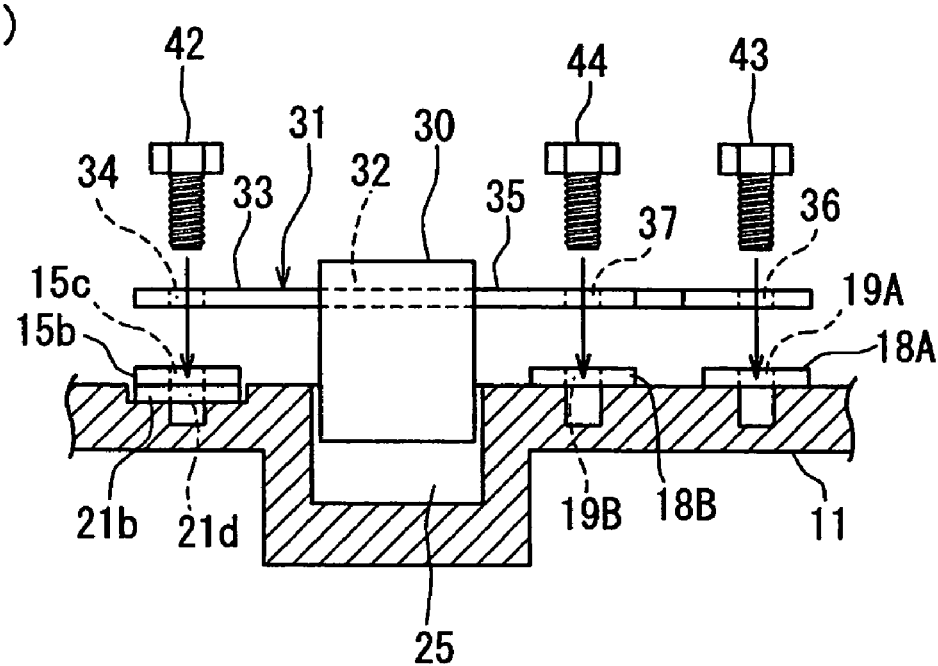
(B)
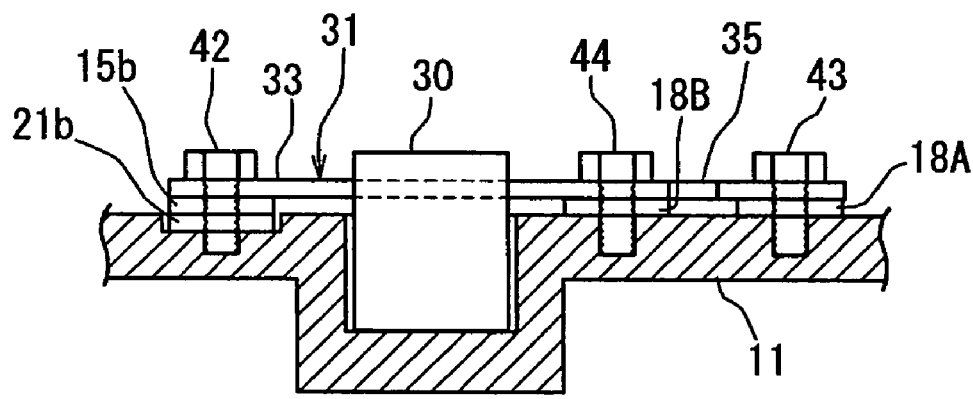

[Fig. 6]
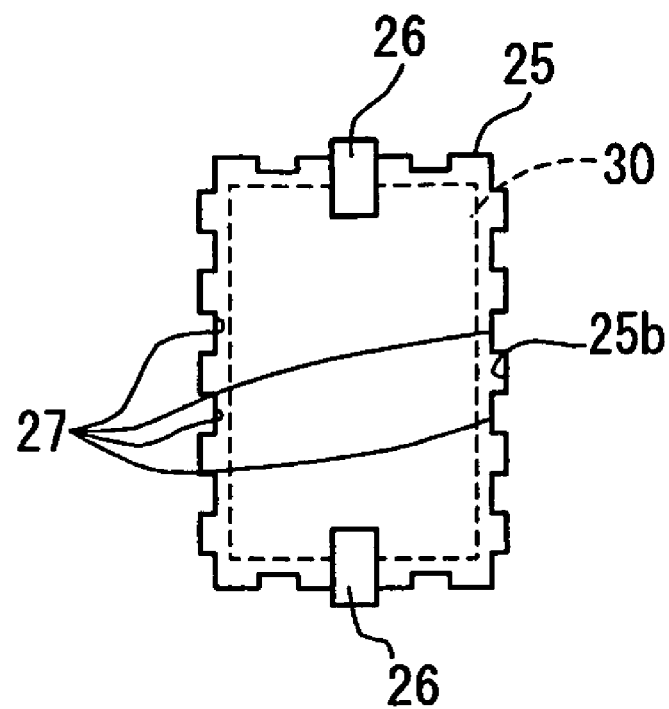

[Fig. 7]
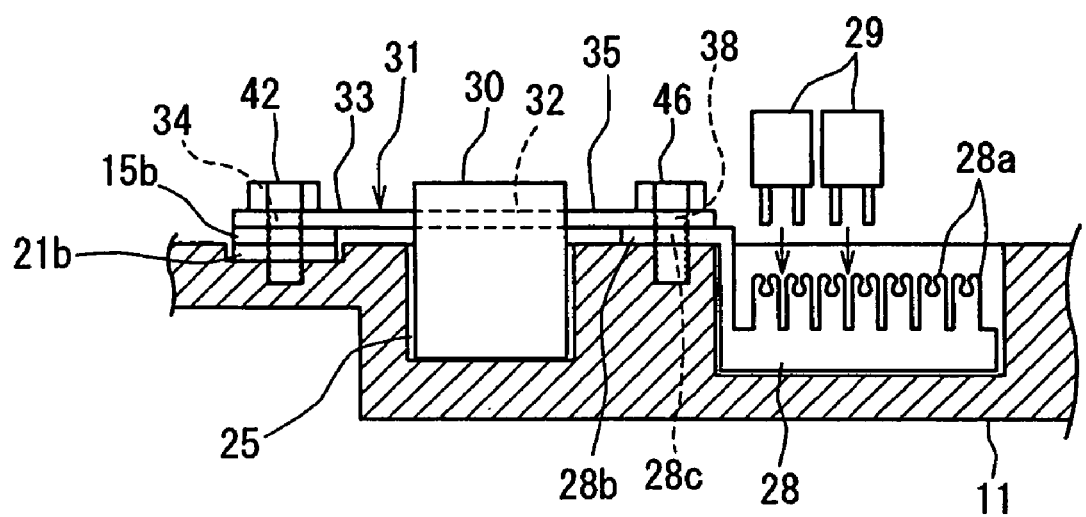

[Fig. 8]
(A)
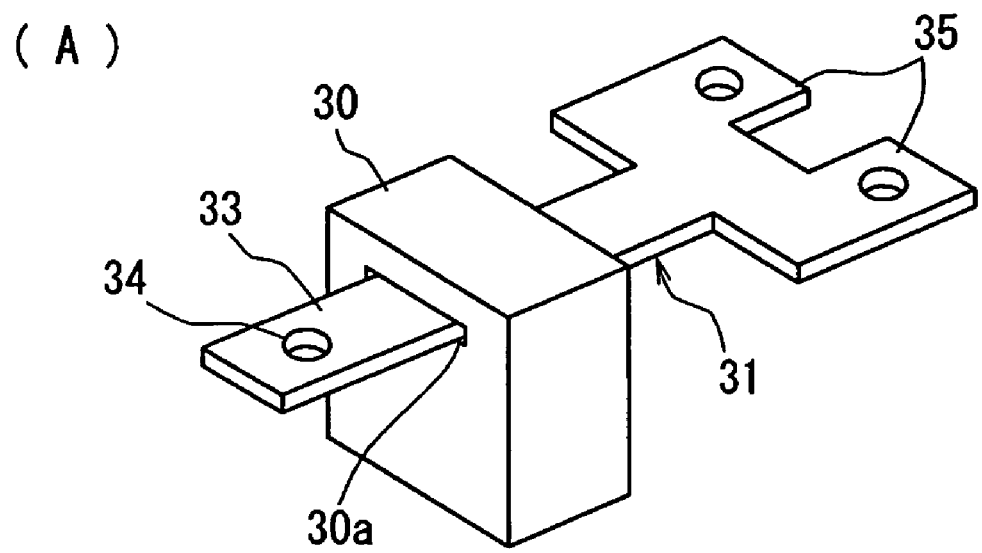
(B)
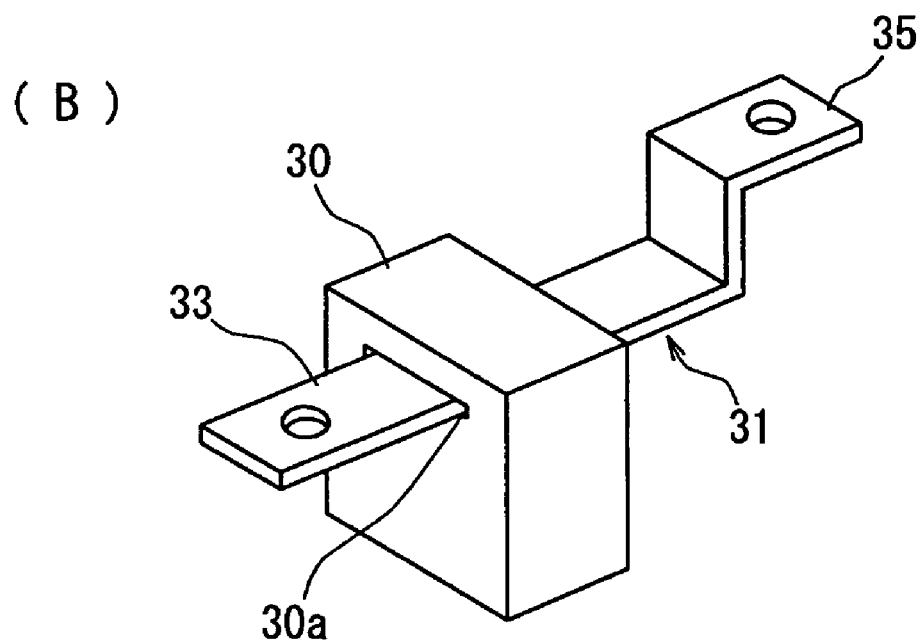

[Fig. 9]
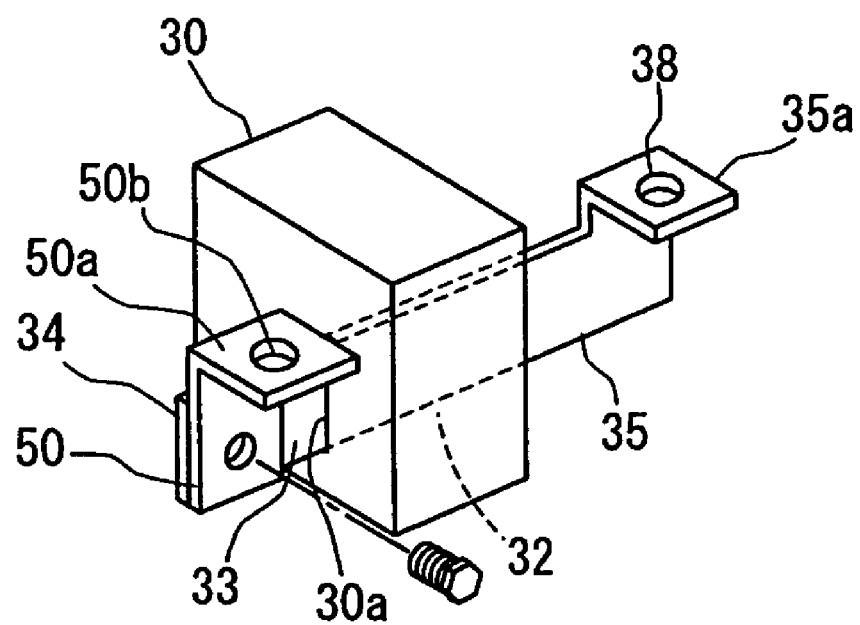

ELECTRICAL JUNCTION BOX PROVIDED WITH ELECTRIC CURRENT SENSOR

CROSS-REFERENCE TO RELATED APPLICATIONS

This application claims priority to JP 2008-198298 filed in Japan on Jul. 31, 2008, the entire disclosure of which is hereby incorporated by reference in its entirety.

BACKGROUND

1. Technical Field

The exemplary embodiments are directed towards an electrical junction box provided with an electric current sensor for detecting an electric current flowing in bus bars in a casing.

2. Background Art

Heretofore, various electrical junction box provided with such a kind of electric current sensor have been supplied.

For example, the present applicant has disclosed an electrical junction box in JP 2007-28773 A. In an electrical junction box 1 to be mounted in a motor vehicle, as shown in FIGS. 10A and 10B, a casing includes an upper casing 2 and a lower casing 3a containing in an upper part a laminated member 4 in which bus bars 4a are laminated alternately with insulation plates 4b, and containing an electric current sensor 5 below the laminated member 4. A special bus bar 6 penetrates a through-hole 5a in the sensor 5. The bus bar 6 is provided on opposite sides with bolt holes 6a to 6c. An output side bolt hole 6a is communicated with a bolt hole 7a in an output side bus bar 7 so that a bolt 8 secures the bus bars 6 and 7 to each other. A power source line terminal connected to a battery is connected to the input side bolt hole 6b by bolt-fastening while an input terminal of a fusible link is connected to the other input side bolt hole 6c by bolt-fastening.

However, because the laminated member 4 is disposed above the electric current sensor 5 in the electrical junction box 1 having the above construction, the electrical junction box 1 must be disassembled in order to remove the electric current sensor 5 from the electrical junction box 1, in the case where a malfunction occurs in the electric current sensor. Accordingly, there is a room to improve the electrical junction box in view of maintenance.

Also, because the electric current sensor 5 having a great calorific value is disposed in a bottom side of the casing, the electric current sensor is likely to easily increase a temperature in an internal space in the casing, thereby readily heat-affecting the bus bars and electrical components disposed above the electric current sensor. Accordingly, there is a room to improve the electrical junction box in view of heat radiation.

SUMMARY

The exemplary embodiments address or resolve the above problems and other problems by providing an electrical junction box installed with an electric current sensor wherein the electric current sensor can be readily removed from a casing merely by removing an upper cover and releasing bolts, thereby improving maintenance and heat radiation of the electric current sensor.

More specifically, an electrical junction box includes a casing having an upper end part, and an electric current sensor disposed in the upper end part of the casing. The electric sensor defines a through-hole. The electrical junction box further includes a detecting bus bar having opposite ends, and penetrating the through-hole in the electric current sensor so that the opposite ends of the detecting bus bar project from the through-hole. The opposite ends are provided with bolt holes. The electrical junction box also has an input side bus bar and an output side bus bar that are disposed below the opposite ends of the detecting bus bar and define bolt holes to be communicated with the bolt holes in the detecting bus bar. Bolts are inserted downward into the bolt holes of the detecting bus bar and the bolt holes of the input side bus bar and the output side bus bar so that the detecting bus bar is secured to the input and output side bus bars while the bolt holes are communicated with one another. The electric current sensor is configured to be removed from the casing by releasing the bolts.

As described above, in the electrical junction box according to the exemplary embodiments, the electric current sensor is disposed in the upper end part of the casing, the opposite ends of the detecting bus bar penetrating the electric current sensor are disposed on the upper surfaces of the input and output side bus bars, and the connecting bolts are inserted downward into the bolt holes to secure the ends to the bus bars by bolt-fastening. Accordingly, it is possible to remove the electric current sensor from the casing merely by releasing the bolt-fastening from an upper side when the electric current sensor must be detached from the casing, thereby carrying out a work for detaching the electric current sensor from the casing from the upper side of the casing. That is, after removing the upper cover from the casing, the bolt-fastening is released, and the electric current sensor is taken off upward from the casing. Accordingly, it is not necessary to disassemble the electrical junction box when the electric current sensor must be repaired or exchanged, thereby enhancing maintenance of the electric current sensor.

Also, because the electric current sensor having a great calorific value is disposed in the upper end part of the casing, it is possible to enhance heat radiation of the electric current sensor in comparison with the case where the electric current sensor is disposed on the bottom surface side of the casing, thereby restraining overheat in the casing and enhancing stability of quality.

Although in an exemplary embodiment, any electrical components are not disposed above the bolt-fastening portions, so long as the electrical components (fuses or the like) are detachably mounted on the casing, the bolt-fastening portions may be disposed below the electrical components.

The detecting bus bar may include a flat bus bar to be disposed in a horizontal direction or an upright bus bar to be disposed in a vertical direction. One end of the opposite ends of the detecting bus bar is configured to project from the through-hole in the electric current sensor and may extend in a straight or substantially straight manner, and the other end of the opposite ends of the detecting bus bars is configured to project from the through-hole in the electric current sensor and may be bent or branched.

As described above, because, if the one end penetrating the electric current sensor extends in a straight or substantially straight manner, the one end can be removed from the electric current sensor by drawing the one end from the through-hole, and the other end projecting from the through-hole may be bent or branched.

If the bus bars to be disposed in the casing, including the detecting bus bar penetrating the electric current sensor, are upright bus bars, it is possible to reduce an installing space in comparison with a flat bus bar to be disposed in a horizontal direction, thereby downsizing the electrical junction box.

In an exemplary embodiment, the electric current sensor defines a through-hole in an upper part of the electric current sensor. A lower part of the electric current sensor is disposed in a recess provided in an upper surface of the casing. A clearance for heat radiation is defined between an exterior of the electric current sensor and a bottom surface and an inner peripheral surface of the recess.

Because the above clearance can define an air flowing passage between the electric current sensor and the peripheral wall and bottom wall of the recess as well as the upper surface of the electric current sensor, it is possible to further enhance heat radiation.

If the recess that contains the electric current sensor is disposed at desired potions on a peripheral wall with a plurality of indentations that extend to the upper end opening edge of the recess, it is possible to further enhance heat radiation.

In an exemplary embodiment, the recess is disposed on a peripheral edge with temporary lock means for temporarily locking the electric current sensor on the casing. The electric current sensor is configured to regularly locked on the casing by bolt-fastening.

The detecting bus bar penetrates the electric current sensor and the temporary lock means holds the electric current sensor in the recess. The bolt holes in the input and output side bus bars are communicated with the bolt holes in the detecting bus bar and the bolts are inserted downward into the bolt holes to carry out bolt-fastening. Consequently, it is possible to enhance or improve the labor required in attaching the electric current sensor to the casing.

In particular, because, in the case where a clearance for heat radiation is defined between the bottom surface of the recess and the lower surface of the electric current sensor, and the recess cannot support the electric current sensor, it may be necessary to hold the electric current sensor by the temporary lock means before regularly locking the electric current sensor by the bolts.

As described above, according to the exemplary embodiments, in the case where a malfunction occurs in the electric current sensor and the electric current sensor must be removed, the heads of the bolts that secure the detecting bus bar penetrating the electric current sensor to the input and output side bus bars are exposed above the upper surface of the casing. Accordingly, it is possible to disconnect the electric current sensor from the circuits in the electrical junction box and to remove the electric current sensor from the casing merely by releasing the bolts at upper side. Thus, in the case where the upper cover is mounted on the upper surface of the casing, it is possible to remove the electric current sensor from the casing merely by removing the upper cover from the casing without disassembling the whole electrical junction box, thereby enhancing maintenance.

Also, because the electric current sensor is disposed in the upper end part of the casing, it is possible to enhance heat radiation. If a clearance is defined between the electric current sensor and the recess for containing the electric current sensor in the casing, the clearance serves as a heat radiation passage, thereby enhancing heat radiation for the electric current sensor having a great calorific value. Accordingly, it is possible to restrain the casing from increasing to an undesirable temperature and to reduce heat influence to the bus bars and electrical components contained in the casing.

BRIEF DESCRIPTION OF THE DRAWINGS

FIG. 2 is an exploded perspective view of the electrical junction box shown in FIG. 1, illustrating a structure in which electrical components are assembled in a casing;

FIG. 3 is an exploded perspective view of a main part of a power source line bus bar, illustrating a structure in which the power source line bus bar is assembled in the casing in accordance with the first exemplary embodiment;

FIG. 4A is a plan view of an electric current sensor, illustrating the electric current sensor contained in a recess in the casing in accordance with the first exemplary embodiment, and FIG. 4B is a cross section view of the electric current sensor taken along lines B-B in FIG. 4A;

FIGS. 5A and 5B are cross-sectional views of the bus bars and casing, illustrating steps of securing the electric current sensor and a detecting bus bar to the casing by bolt-fastening in accordance with the first exemplary embodiment;

FIG. 6 is a plan view of a main part of an alteration in accordance with the first embodiment;

FIG. 7 is a cross-sectional view of a main part of a second exemplary embodiment of the electrical junction box;

FIGS. 8A and 8B are perspective views of other detecting bus bars in an exemplary embodiment;

FIG. 9 is a perspective view of another detecting bus bar in an exemplary embodiment.

DETAILED DESCRIPTION OF EMBODIMENTS

Figure 1:
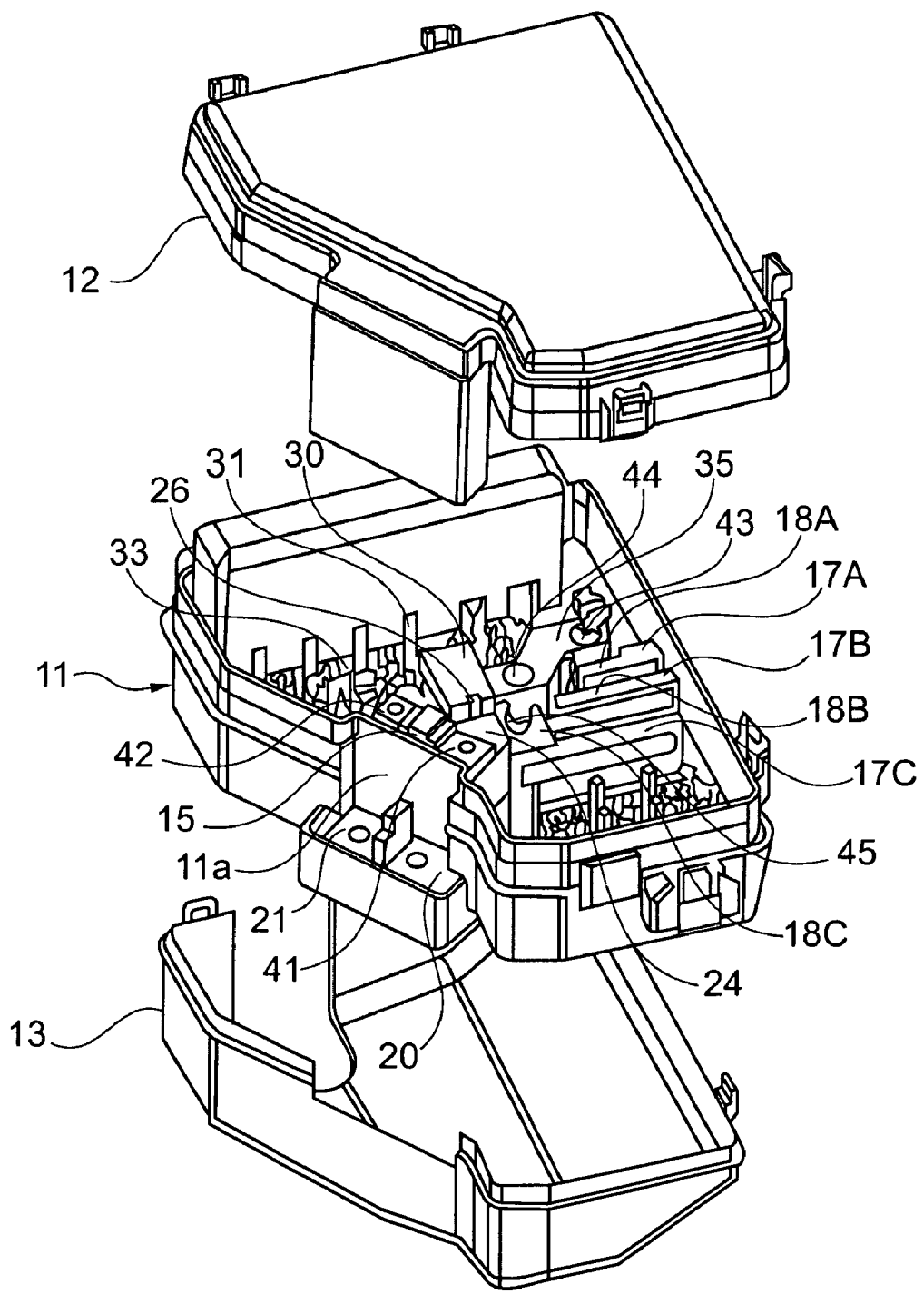
FIG. 1 is an exploded perspective view of a first embodiment of an electrical junction box.
Figure 10A:
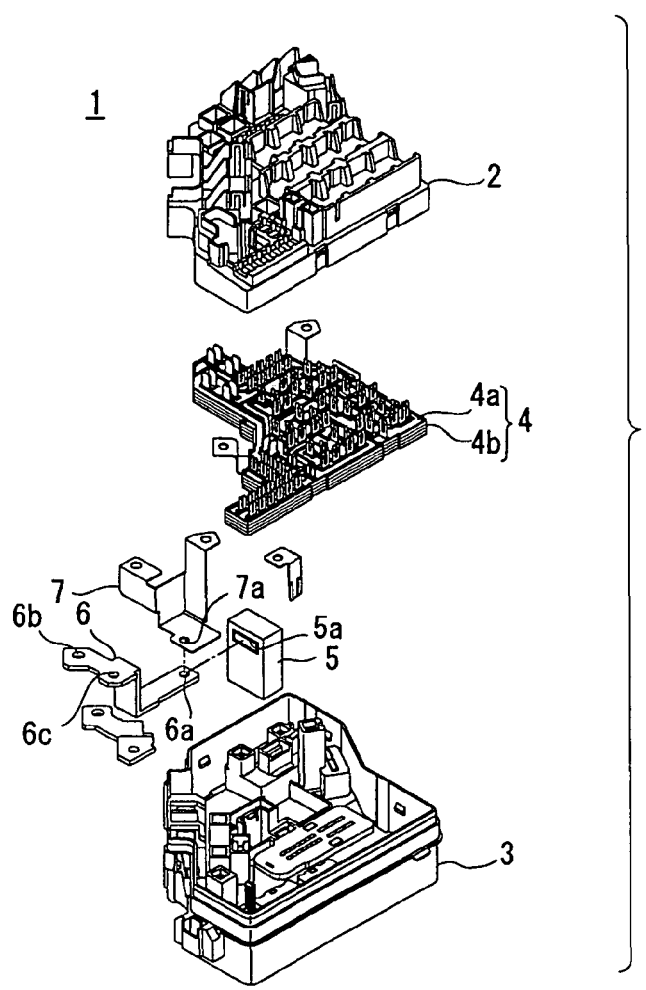
FIG. 10A is an exploded perspective view of a prior art electrical junction box in an exemplary embodiment.
Figure 10B:
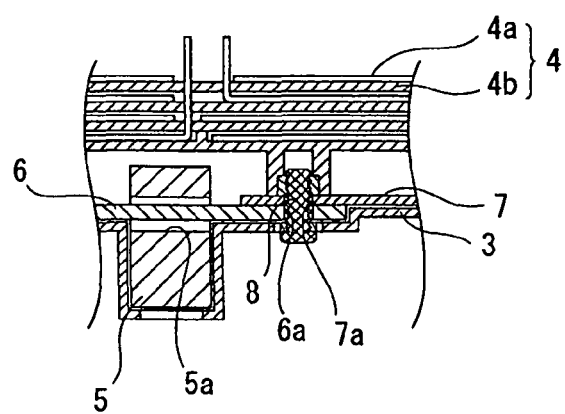
FIG. 10B is a cross section view of a main part of the prior art electrical junction box shown in FIG. 10A.

Referring now to the drawings, embodiments of an electrical junction box in accordance with the exemplary embodiments will be described below.

FIGS. 1 to 5 show a first embodiment of an electrical junction box 10 for a motor vehicle.

As shown in FIG. 1, the electrical junction box 10 includes a casing 11, an upper cover 12 to be mounted on an upper surface of the casing 11, and a lower cover 13 to be attached to a lower surface of the casing 11. The casing 11 contains and secures an internal circuit body including an upright bus bar (not shown), and also contains a fuse 15, and a plurality of fusible links 17A, 17B, 17C.

As shown in FIGS. 2 and 3, a power source line bus bar 20 and an ACG bus bar 21 are attached to a side wall 11a of the casing 11 so that the bus bars 20 and 21 bridge inner and outer sides of the casing 11. The power source line bus bar 20 includes a power source line connecting portion 20a and a bus bar connecting portion 20b. The power source line connecting portion 20a has an upper end bent horizontally at an outer side of the side wall 11a so that the upper end is adapted to secure by a bolt a terminal (not shown) connected to a distal end of a power source line connected to a battery. The bus bar connecting portion 20b has an upper end bent horizontally at an inner side of the side wall 11a. Bolt holes 20c and 20d are provided in the power source line connecting portion 20a and bus bar connecting portion 20b, respectively.

The ACG bus bar 21 is formed into a substantially symmetric configuration with respect to the power source line bus bar 20. The ACG bus bar 21 has an alternator connecting portion 21a at the outer side of the side wall 11a and a bus bar connecting portion 21b at the inner side of the side wall 11a. Bolt holes 21c and 21d are provided in the alternator connecting portion 21a and bus bar connecting portion 21b, respectively.

As shown in FIG. 1, the power source line bus bar 20 and ACG bus bar 21 are interconnected through the fuse 15. In more detail, as shown in FIG. 2, the fuse 15 includes plate-like connecting portions 15a and 15b extending horizontally from opposite sides. The connecting portions 15a and 15b of the fuse 15 are disposed on upper surfaces of the bus bar connecting portion 20b of the power source line bus bar 20 and the bus bar connecting portion 21b of the ACG bus bar 21 and are secured to the portions 20b and 21b by bolts 41 and 42, respectively.

The casing 11 is provided on the upper surface with a recess 25 (FIG. 4A). A lower part of an electric current sensor 30 is contained in the recess 25 so that the sensor 30 projects upward from the upper surface of the casing 11 and is disposed in an upper end part of the casing 11.

As shown in FIGS. 4A and 4B, a clearance S1 is provided between a lower surface 30b and an outer surface 30c of the electric current sensor 30 contained in the recess 25 and a bottom surface 25a and an inner peripheral surface 25b of the recess 25. In the first embodiment, a width of the clearance S1 is set to be 0.2 mm.

The recess 25 is provided on an upper opening peripheral edge with a pair of temporary lock pieces 26 that project upward and are provided on upper ends with lock pawls 26a. The lock pawls 26 catch an upper surface 30d of the electric current sensor 30 to temporarily lock the sensor 30.

The electric current sensor 30 is provided with a through-hole 30a adapted to pass a detecting bus bar 31. An electrical wire is connected through a connector to a lower surface of the electric current sensor 30. When the electric current sensor 30 senses an electric current in the detecting bus bar 31, a detecting signal is transmitted through the electric current to an engine control unit (not shown).

The detecting bus bar 31 includes a flat bus bar to be disposed in a horizontal direction. As shown in FIG. 2 and FIGS. 5A and 5B, the detecting bus bar 31 has an input side portion 33 and an output side portion 35. The input side portion 33 extends from a portion 32 inserted in the electric current sensor 30 to an input side in a substantially straight manner and is provided with a single bolt hole 34. The output side portion 35 of the detecting bus bar 31 extends from the inserted portion 32 to an output side, is formed into a crank-like configuration in a horizontal direction, and is provided with two bolt holes 36, 37.

As shown in FIG. 1 and FIGS. 5A and 5B, the input side portion 33 of the detecting bus bar 31 is disposed on an upper surface of the connecting portion 15b of the fuse 15 to be connected to the power source line bus bar 20. The bolt hole 34 in the input side portion 33, the bolt hole 15c in the connecting portion 15b of the fuse 15, and the bolt hole 21d in the bus bar connecting portion 21b of the ACG bus bar 21 are communicated with one another. The bolt 42 is inserted downward into the communicated bolt holes 34, 15c, and 21d so as to connect the detecting bus bar 31 to the fuse 15 and ACG bus bar 21 together by bolt-fastening to secure them to the casing 11.

As shown in FIG. 1 and FIGS. 5A and 5B, the output side portion 35 of the detecting bus bar 31 is disposed on upper surfaces of the input terminal portions 18A and 18B including bus bars projecting horizontally from upper ends of the fusible links 17A and 17B. The bolt hole 36 in the output side portion 35 and the bolt hole 19A in the input terminal portion 18A of the fusible link 17A are communicated with each other while the bolt hole 37 in the output side portion 35 and the bolt hole 19B in the input side portion 18B of the fusible link 17B are communicated with each other. Bolts 43 and 44 are inserted downward into the communicated bolt holes 36, 19A and 37, 19B so as to connect the detecting bus bar 31 to the fusible links 17A and 17B by bolt-fastening, respectively.

The fusible link 17C is directly connected to the power source line bus bar 20 without interposing the electric current sensor 30. In more detail, the flat bus bar 24 is connected to the bus bar connecting portion 20b of the power source line bus bar 20 by the bolt 41 while the flat bus bar 24 is connected to the input terminal portion 18C of the fusible link 17C by the bolt 45.

According to the above construction, the detecting bus bar 31 penetrating the electric current sensor 30, as shown in FIGS. 5A and 5B, are connected by bolt-fastening only to the connecting portion 15b of the fuse 15 connected to the power source line bus bar 20 and to the input terminal portions 18A and 18B of the fusible links 17A and 17B and are not connected to the other circuits directly. Thus, it is possible to completely disconnect the detecting bus bar 31 from the circuits in the electrical junction box 10 merely by releasing the bolts 42, 43, 44.

Also, the connecting portion 15b of the fuse 15 to be connected to the input side portion 33 of the detecting bus bar 31 by the bolt 42 is disposed below a lower surface of the input side portion 33, the input terminal portions 18A and 18B of the fusible links 17A and 17B to be connected to the output side portion 35 of the detecting bus bar 31 by the bolts 43 and 44 are disposed below a lower surface of the output side portion 35, and the bolts 42, 43, and 44 are inserted downward into the bolts holes. Thus, when carrying out a maintenance process, it is possible to remove the electric current sensor 30 and detecting bus bar 31 from the casing 11 while lifting up them merely by removing the upper casing 12 from the casing 11 and releasing the bolts 42, 43, and 44.

Accordingly, in the case where any malfunction occurs in the electric current sensor 30, because it is possible to readily remove the electric current sensor 30 from the casing 11 only by carrying out only a work at the upper side of the casing 11 without disassembling the casing 11, it is possible to enhance maintenance of the electric current sensor 30.

Also, because the electric current sensor 30 is disposed in the upper end part of the casing 11 and the electric current sensor 30 is contained in the casing 11 so that the upper part of the sensor 30 is exposed at the upper surface side of the casing 11, heat generated from the electric current sensor 30 is radiated effectively, thereby preventing the casing 11 from causing any malfunction due to overheat in the casing 11.

Furthermore, because the electric current sensor 30 is contained in the recess 25 so that the clearance S1 is provided between the sensor 30 and the recess 25 without being closely contacted with the recess 25, it is possible to efficiently radiate heat from the whole periphery of the electric current sensor 30, thereby further enhancing heat radiation.

FIG. 6 shows an alteration 1 of the first embodiment of the electrical junction box 10 in accordance with the exemplary embodiments.

The recess 25 to contain the electric current sensor 30 is provided on an inner peripheral surface 25b with a plurality of ribs 27 that extend in a vertical direction and are spaced apart from one another in a peripheral direction. Thus, such a heat radiation path extending upward can efficiently radiate heat generated from a bottom surface side of the electric current sensor 30 toward an upper opening in the recess 25.

FIG. 7 shows a second embodiment of the electrical junction box 10 in accordance with the exemplary embodiments.

In the second embodiment, the output side portion 35 of the detecting bus bar 31 penetrating the electric current sensor 30 is connected to an upright bus bar 28 fixed in the casing 11.

In more detail, the upright bus bar 28 includes a plurality of tuning-fork-like terminal portions 28a that are directed upward and are juxtaposed in a longitudinal direction, and a bus bar connecting portion 28b that is formed by bending an upper end of the bus bar 28 in a horizontal direction. A bolt hole 28c is provided in the bus bar connecting portion 28b.

The input side portion 33 and output side portion 35 of the detecting bus bar 31 extend in a straight or substantially straight manner from the inserted portion 32, respectively. The input side portion 33 is provided with a single bolt hole 34 while the output side portion 35 is provided with a single bolt hole 38. The bus bar connecting portion 28b of the upright bus bar 28 is disposed below the output side portion 35 of the detecting bus bar 31, the bolt hole 38 in the output side portion 35 is communicated with the bolt hole 28c in the bus bar connecting portion 28b, a bolt 46 is inserted downward into the bolt holes 38 and 28c to connect the portions 35 and 28b to each other. Plug-in fuses 29 are inserted into the tuning-fork-like terminal portions 28a of the upright bus bar 28. The other constructions in the second embodiment are the same as those of the first embodiment.

In the second embodiment, because the detecting bus bar 31 can be disconnected from the other circuits merely by releasing the bolts 42 and 46 and the detecting bus bar 31 can be removed from the casing 11 as the detecting bus bar 31 is lifted up together with electric current sensor 30, it is possible to enhance maintenance of the electric current sensor 30.

The output side portion 35 of the detecting bus bar 31 may be branched as shown in FIG. 8A, or the portion 35 may be bent in a vertical direction as shown in FIG. 8B.

Furthermore, as shown in FIG. 9, the upright bus bar may be used as the detecting bus bar and may be penetrated into the through-hole 30a in the electric current sensor 30 so as to be disposed in a vertical direction. In this case, an upper end of the output side portion 35 that extends in a straight or substantially straight manner from the through-hole 30a in the electric current sensor 30 is bent in a horizontal direction to define the connecting portion 35a and a bolt hole 38 is provided in the connecting portion 35a. The input side portion 33 extends in a straight or substantially straight manner and is not provided with a bent connecting portion. At a side of the input side portion 33, an L-shaped connecting bus bar 50 is provided on an upper end with a connecting portion 50a bent in a horizontal direction. The L-shaped connecting bus bar 50 is connected to the input side portion 33 by bolt-fastening. A bolt hole 50b is provided in the connecting portion 50a. Mating bus bars are disposed below the connecting portions 35a and 50a and bolts are inserted downward into the bolt holes 38 and 50b to interconnect them.

What is claimed is:

1. An electrical junction box comprising:
   a casing having an upper end part;
   an electric current sensor disposed in the upper end part of the casing, the electric sensor defining a through-hole;
   a detecting bus bar having opposite ends, the detecting bus bar penetrating the through-hole in the electric current sensor so that the opposite ends of the detecting bus bar project from the through-hole, the opposite ends being provided with bolt holes;
   an input side bus bar and an output side bus bar that are disposed below the opposite ends of the detecting bus bar and defining bolt holes to be communicated with the bolt holes in the detecting bus bar; and
   bolts inserted downward into the bolt holes of the detecting bus bar and the bolt holes of the input side bus bar and the output side bus bar so that the detecting bus bar is secured to the input and output side bus bars while the bolt holes are communicated with one another,
   wherein the electric current sensor is configured to be removed from the casing by releasing the bolts.

2. An electrical junction box of claim 1, wherein the detecting bus bar includes a flat bus bar to be disposed in a horizontal direction or an upright bus bar to be disposed in a vertical direction, and
   one end of the opposite ends of the detecting bus bar is configured to project from the through-hole in the electric current sensor and extend in a straight or substantially straight manner, and the other end of the opposite ends of the detecting bus bars is configured to project from the through-hole in the electric current sensor and is bent or branched.

3. An electrical junction box of claim 2, wherein the electric current sensor defines a through-hole in an upper part of the electric sensor, and a lower part of the electric current sensor is disposed in a recess provided in an upper surface of the casing, and a clearance for heat radiation is defined between an exterior of the electric current sensor, and a bottom surface and an inner peripheral surface of the recess.

4. An electrical junction box provided with an electric current sensor according to claim 3, wherein said recess is provided on a peripheral edge of the upper surface of the casing with temporary lock means configured to temporarily lock the electric current sensor on the casing, and the electric current sensor is configured to be regularly locked on said casing by bolt-fastening.

5. An electrical junction box of claim 1, wherein the electric current sensor defines a through-hole in an upper part of the electric sensor, and a lower part of the electric current sensor is disposed in a recess provided in an upper surface of the casing, and a clearance for heat radiation is defined between an exterior of the electric current sensor, and a bottom surface and an inner peripheral surface of the recess.

6. An electrical junction box provided with an electric current sensor according to claim 5, wherein said recess is provided on a peripheral edge of the upper surface of the casing with temporary lock means configured to temporarily lock the electric current sensor on the casing, and the electric current sensor is configured to be regularly locked on said casing by bolt-fastening.

* * * * *